(12) United States Patent
Zhang et al.

(10) Patent No.: US 12,207,497 B2
(45) Date of Patent: Jan. 21, 2025

(54) DISPLAY DEVICE AND POLARIZER

(71) Applicants: Chengdu BOE Optoelectronics Technology Co., Ltd., Sichuan (CN); BOE TECHNOLOGY GROUP CO., LTD., Beijing (CN)

(72) Inventors: Jiaxiang Zhang, Beijing (CN); Kang Wang, Beijing (CN); Xiaoxia Liu, Beijing (CN); Haotian Yang, Beijing (CN); Junhui Yang, Beijing (CN); Fuzheng Xie, Beijing (CN); Bin Zhang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 617 days.

(21) Appl. No.: 17/440,917

(22) PCT Filed: Feb. 9, 2021

(86) PCT No.: PCT/CN2021/076125
§ 371 (c)(1),
(2) Date: Sep. 20, 2021

(87) PCT Pub. No.: WO2021/164630
PCT Pub. Date: Aug. 26, 2021

(65) Prior Publication Data
US 2022/0158142 A1 May 19, 2022

(30) Foreign Application Priority Data
Feb. 17, 2020 (CN) .......................... 202010097657.X

(51) Int. Cl.
*H10K 50/80* (2023.01)
*G02B 5/30* (2006.01)
(Continued)

(52) U.S. Cl.
CPC ......... *H10K 50/868* (2023.02); *G02B 5/3025* (2013.01); *H10K 59/65* (2023.02)

(58) Field of Classification Search
CPC . H10K 50/868; G02B 5/3025; H04M 1/0264; B32B 2307/42; B32B 2457/20;
(Continued)

(56) References Cited

U.S. PATENT DOCUMENTS

2020/0050047 A1   2/2020  Son et al.
2020/0225394 A1*  7/2020  Guo .......................... G02B 5/30
2021/0057673 A1*  2/2021  Yu ......................... H10K 50/865

FOREIGN PATENT DOCUMENTS

CN   108845439 A   11/2018
CN   109116603 A    1/2019
(Continued)

OTHER PUBLICATIONS

China Patent Office, CN202010097657.X First Office Action issued on Apr. 9, 2021.
China Patent Office, CN202010097657.X Second Office Action issued on Dec. 2, 2021.
"Nontraditional Manufacturing Technology Roadmaps" issued on Nov. 23, 2021 and the English Abstract, China Mechanical Engineering Association, China Science and Technology Press.

*Primary Examiner* — Antonio B Crite
(74) *Attorney, Agent, or Firm* — HOUTTEMAN LAW LLC

(57) ABSTRACT

A display device includes: a display panel; and a polarizer, an optical adhesive, and a cover plate sequentially arranged on the display panel. The display panel has a transparent region. The polarizer has first and second surfaces parallel to each other, and the first surface is proximal to the display panel. The polarizer has therein a through hole penetrating through the first and second surfaces. The through hole has first and second boundaries at the first and second surfaces, respectively. An orthogonal projection of the first boundary on the second surface is inside and not in contact with the second boundary. For third and fourth boundaries of the
(Continued)

through hole parallel to the first boundary, an orthogonal projection of the third boundary on the fourth boundary does not extend beyond the fourth boundary, the third boundary being closer to the first boundary than the fourth boundary.

20 Claims, 3 Drawing Sheets

(51) Int. Cl.
  *G09F 9/33* (2006.01)
  *H10K 59/65* (2023.01)
(58) Field of Classification Search
  CPC ............... B32B 3/266; B32B 17/10458; G02F 1/133528
  See application file for complete search history.

(56) References Cited

FOREIGN PATENT DOCUMENTS

| CN | 109307962 A | * | 2/2019 | ....... G02F 1/133512 |
|----|-------------|---|--------|----------------------|
| CN | 109407198 A |   | 3/2019 |                      |
| CN | 110133902 A |   | 8/2019 |                      |
| CN | 110164297 A |   | 8/2019 |                      |
| CN | 110233167 A |   | 9/2019 |                      |
| CN | 110244488 A |   | 9/2019 |                      |
| CN | 210378174 U |   | 4/2020 |                      |
| CN | 111524469 A |   | 8/2020 |                      |
| CN | 111584738 A |   | 8/2020 |                      |
| CN | 211669474 U |   | 10/2020|                      |

* cited by examiner

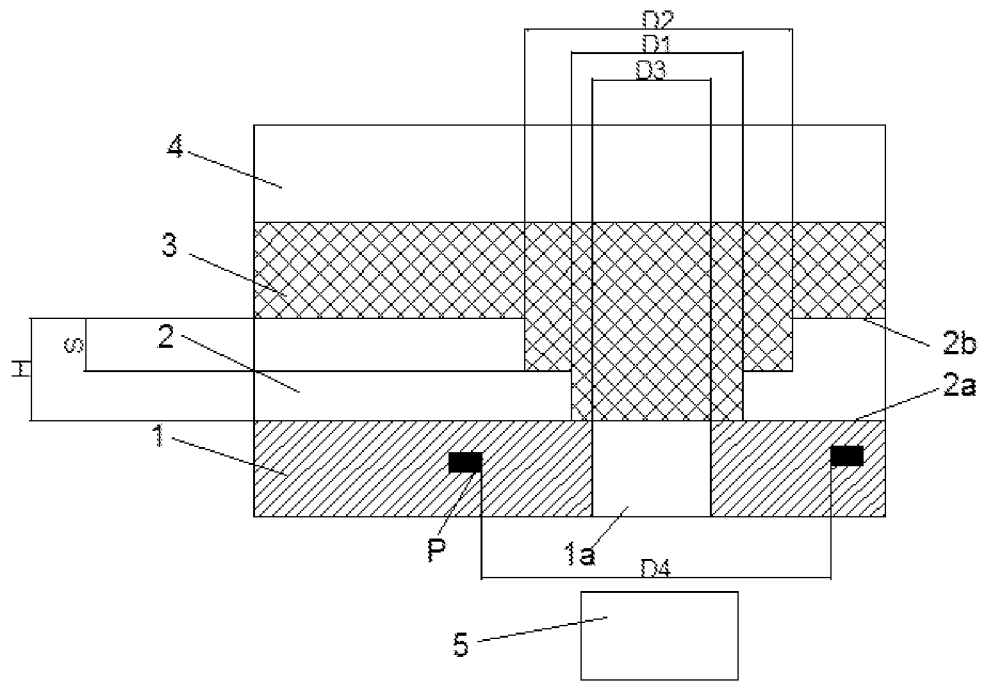

FIG. 3b

| Forming a polarizer body, wherein the polarizer body has a first surface and a second surface which are parallel to a plane where the polarizer body is located | — S1 |

| Forming a through hole to penetrate through the first surface and the second surface, wherein a boundary formed by the through hole at the first surface is a first boundary, a boundary formed by the through hole at the second surface is a second boundary, an orthogonal projection of the first boundary on a plane where the second surface is located is inside the second boundary and is not in contact with the second boundary, and for boundaries formed by the through hole at any two planes parallel to the plane where a polarizer is located, an orthogonal projection of a boundary closer to the first surface on a plane where a boundary farther away from the first surface is located does not extend beyond the boundary farther away from the first surface | — S2 |

FIG. 4

DISPLAY DEVICE AND POLARIZER

CROSS-REFERENCE TO RELATED APPLICATIONS

This is a National Phase Application filed under 35 U.S.C. 371 as a national stage of PCT/CN2021/076125 filed on Feb. 9, 2021 an application claiming priority to Chinese patent application No. 202010097657.X, filed on Feb. 17, 2020, the content of each of which is incorporated herein by reference in its entirety.

TECHNICAL FIELD

The present disclosure relates to the field of display technologies, and in particular to a display device and a polarizer.

BACKGROUND

A full-screen display device (i.e., a display device in which a ratio of an area of a display region to the total area of a light outgoing surface of a display panel of the display device is equal to or substantially equal to 1) can provide a better visual experience to a user, and thus is attracting attention from more and more users. In order to realize full-screen displaying, it is desirable to dispose a camera on the back of the display panel. In this case, it is desirable to provide a transparent region at an edge of the display region or within the display region of the display panel such that the camera provided on the back of the display panel can take (or generate) a clear image through the transparent region.

SUMMARY

A first aspect of the present disclosure provides a display device, which includes:
- a display panel; and
- a polarizer, an optical adhesive, and a cover plate sequentially arranged on the display panel, wherein
- the display panel has a transparent region;
- the polarizer has a first surface and a second surface which are parallel to a plane where the polarizer is located, the first surface is closer to the display panel than the second surface, and the polarizer has therein a through hole penetrating through the first surface and the second surface; a boundary of the through hole at the first surface is a first boundary, a boundary of the through hole at the second surface is a second boundary, and an orthogonal projection of the first boundary on a plane where the second surface is located is inside the second boundary and is not in contact with the second boundary;
- for boundaries of the through hole at any two planes parallel to the plane where the polarizer is located, an orthogonal projection of a boundary closer to the first surface on a plane where a boundary farther away from the first surface is located does not extend beyond the boundary farther away from the first surface; and
- the transparent region is opposite to the through hole of the polarizer, and the optical adhesive is a cured liquid optical adhesive.

In an embodiment, the through hole gradually narrows down in a direction from the second surface to the first surface.

In an embodiment, a space defined by the through hole has a shape of a frustum of cone.

In an embodiment, a sidewall of the through hole and a normal of the plane where the polarizer is located have an angle equal to or greater than 45° therebetween.

In an embodiment, the angle between the sidewall of the through hole and the normal of the plane where the polarizer is located is equal to 77°.

In an embodiment, a sidewall of the through hole has a stepped shape.

In an embodiment, a space defined by the through hole includes a plurality of cylinders having diameters gradually decreasing in a direction from the second surface to the first surface, and an axis of each of the plurality of cylinders is perpendicular to the plane where the polarizer is located.

In an embodiment, axes of the plurality of cylinders coincide with each other.

In an embodiment, an orthogonal projection of the transparent region on a plane where the first surface is located is within the first boundary, and a distance between an outside of the orthogonal projection of the transparent region on the plane where the first surface is located and the first boundary is greater than 0.05 mm.

In an embodiment, the second boundary is inside an orthogonal projection of a pixel region of the display panel on the plane where the second surface is located, and spaced apart from the orthogonal projection of the pixel region of the display panel on the plane where the second surface is located by a distance greater than 0.1 mm.

In an embodiment, the transparent region has a shape of a circle, the first boundary has a shape of a circle, the second boundary has a shape of a circle, and the pixel region has a shape of a circle.

In an embodiment, orthogonal projections of centers of the circles of the transparent region, the first boundary, the second boundary, and the pixel region on the plane where the polarizer is located coincide with each other.

In an embodiment, the display panel is an organic light emitting diode display panel.

In an embodiment, the display device further includes a camera which is on a side of the display panel distal to the polarizer, and is opposite to the transparent region.

In an embodiment, the camera and the transparent region overlap each other in a direction perpendicular to the plane where the polarizer is located.

A second aspect of the present disclosure provides a polarizer, which includes a first surface and a second surface which are parallel to a plane where the polarizer is located, wherein the polarizer has therein a through hole penetrating through the first surface and the second surface, a boundary of the through hole at the first surface is a first boundary, a boundary of the through hole at the second surface is a second boundary, and an orthogonal projection of the first boundary on a plane where the second surface is located is inside the second boundary and is not in contact with the second boundary; and for boundaries of the through hole at any two planes parallel to the plane where the polarizer is located, an orthogonal projection of a boundary closer to the first surface on a plane where a boundary farther away from the first surface is located does not extend beyond the boundary farther away from the first surface.

In an embodiment, the through hole gradually narrows down in a direction from the second surface to the first surface.

In an embodiment, a space defined by the through hole has a shape of a frustum of cone.

In an embodiment, a sidewall of the through hole and a normal of the plane where the polarizer is located have an angle equal to or greater than 45° therebetween.

In an embodiment, the angle between the sidewall of the through hole and the normal of the plane where the polarizer is located is equal to 77°.

In an embodiment, a sidewall of the through hole has a stepped shape.

In an embodiment, a space defined by the through hole includes a plurality of cylinders having diameters gradually decreasing in a direction from the second surface to the first surface, and an axis of each of the plurality of cylinders is perpendicular to the plane where the polarizer is located.

In an embodiment, axes of the plurality of cylinders coincide with each other.

In an embodiment, the first boundary has a shape of a circle, and the second boundary has a shape of a circle.

In an embodiment, orthogonal projections of centers of the circles of the first boundary and the second boundary on the plane where the polarizer is located coincide with each other.

Since the sidewall of the through hole of the polarizer is not vertical but gradually narrows down in the direction from the second surface to the first surface, in a case where the polarizer is applied to the manufacturing of a display device, where the polarizer is positioned above a display panel, and where the first surface is proximal to the display panel, a liquid optical adhesive can continuously flow into the through hole from the second surface along the relatively gentle (i.e., not steep) sidewall of the through hole, thereby suppressing generation of defects such as an air bubble at the top of the through hole.

BRIEF DESCRIPTION OF THE DRAWINGS

FIG. 3b is a schematic cross-sectional view of a display device according to some other embodiments of the present disclosure.

FIG. 4 is a schematic flowchart of a method for manufacturing a polarizer according to an embodiment of the present disclosure.

DETAILED DESCRIPTION

To enable one of ordinary skill in the art to better understand technical solutions of the present disclosure, the present disclosure will be further described below in detail with reference to the accompanying drawings and exemplary embodiments.

Unless defined otherwise, technical or scientific terms used herein should have the same meaning as commonly understood by one of ordinary skill in the art to which the present disclosure belongs. The terms of "first", "second", and the like used herein are not intended to indicate any order, quantity, or importance, but rather are used for distinguishing one element from another. For example, a "first element" and a "second element" in an embodiment may be referred to as a "second element" and a "first element" in another embodiment, respectively. Further, the term "a", "an", "the", or the like does not denote a limitation of quantity, but rather denotes the presence of at least one element. The term of "comprising", "including", or the like means that the element or item preceding the term contains the element or item listed after the term and the equivalent thereof, but does not exclude the presence of other elements or items. The terms "connected", "coupled", and the like are not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Figure 1:
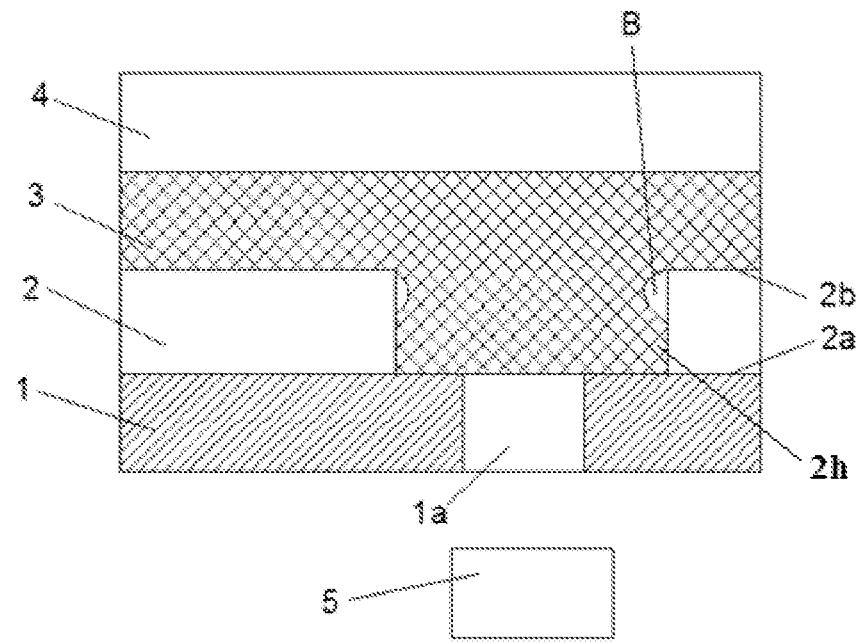
FIG. 1 is a schematic diagram showing a structure of a display device according to an embodiment of the present disclosure.

FIG. 1 is a schematic diagram (e.g., cross-sectional view) showing a structure of a display device according to an embodiment of the present disclosure. Referring to FIG. 1, the display device includes a display panel 1; a polarizer 2, an optical adhesive 3, and a cover plate 4 sequentially disposed on a front surface (e.g., a light outgoing surface) of the display panel 1; and a camera 5 disposed on a side of the display panel 1 distal to the polarizer 2. In order to realize the full-screen displaying and a photographing function, a region (or a part) of the display panel 1 opposite to the camera 5 is a transparent region 1a, a through hole 2h is formed in a region (or a part) of the polarizer 2 opposite to the camera 5 (so as to prevent the polarizer 2 from attenuating external light), and the optical adhesive 3, which is in a liquid state, is used for attaching the polarizer 2 and the cover plate 4 to each other.

In the present embodiment, the through hole 2h having a sidewall perpendicular to a plane where the polarizer 2 is located (i.e., perpendicular to a first surface 2a or a second surface 2b of the polarizer 2) is formed in the polarizer 2 through a die cutting process (or a punching process). The display panel 1, the polarizer 2, the optical adhesive 3, and the cover plate 4 may be fixed together to form a display device, by filling the through hole 2h with the liquid optical adhesive 3 and coating the liquid optical adhesive 3 on the second surface 2b of the polarizer 2 and then curing the liquid optical adhesive 3.

The inventors of the present inventive concept have found that in the present embodiment, the through hole 2h formed in the polarizer 2 through the die cutting process (or punching process) penetrates through the polarizer 2 and thus has a large depth (i.e., a size (or dimension) in the direction perpendicular to the plane where the polarizer 2 is located), and a sidewall of the polarizer 2 is perpendicular to the plane where the polarizer 2 is located. As such, when the liquid optical adhesive 3 is filled in the through hole 2h, the fluidity of the liquid optical adhesive 3 is poor, and therefore, An air bubble B is easily formed at a corner of the through hole 2h on a side of the through hole 2h distal to the display panel 1. The air bubble B will change the propagation direction of light incident on the camera 5 from the outside, which reduces a clarity of an image captured by the camera 5.

At least to ensure that an image taken by the camera 5 disposed on the side of the display panel 1 distal to the polarizer 2 has a good clarity, other embodiments of the present disclosure provide a polarizer and a display device including the polarizer, as described below.

Figure 2A:
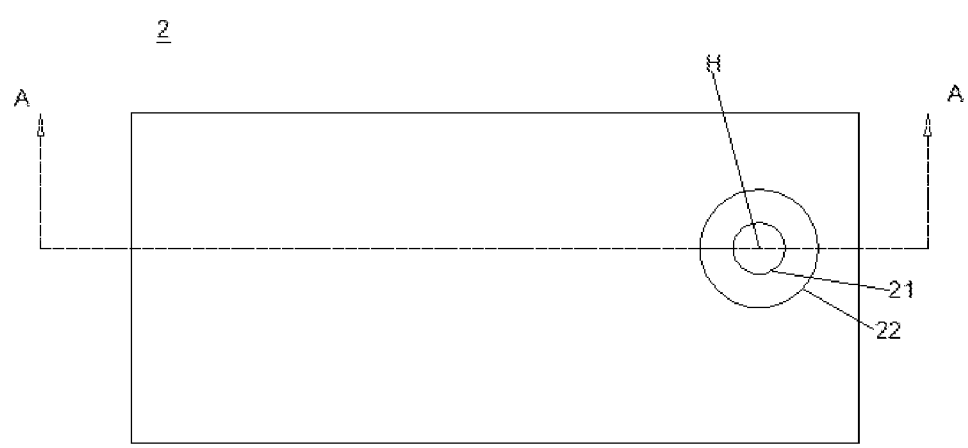
FIG. 2a is a schematic top view of a polarizer according to an embodiment of the present disclosure.
Figure 2B:
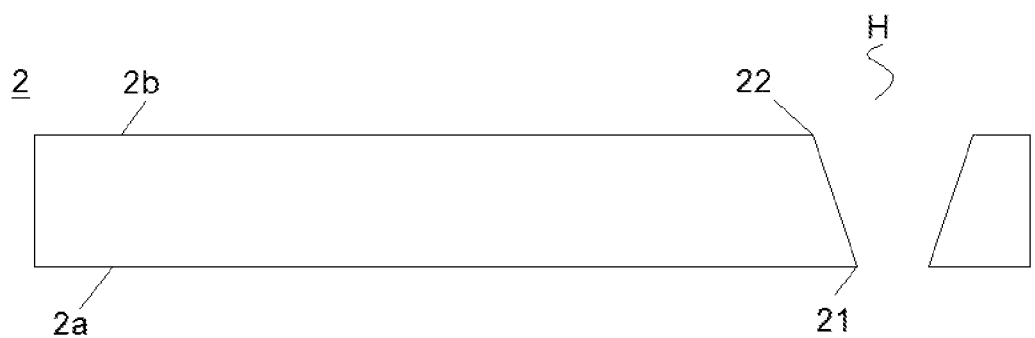
FIG. 2b is a schematic cross-sectional view of the polarizer shown in FIG. 2a taken along a line AA, according to some embodiments of the present disclosure.
Figure 2C:
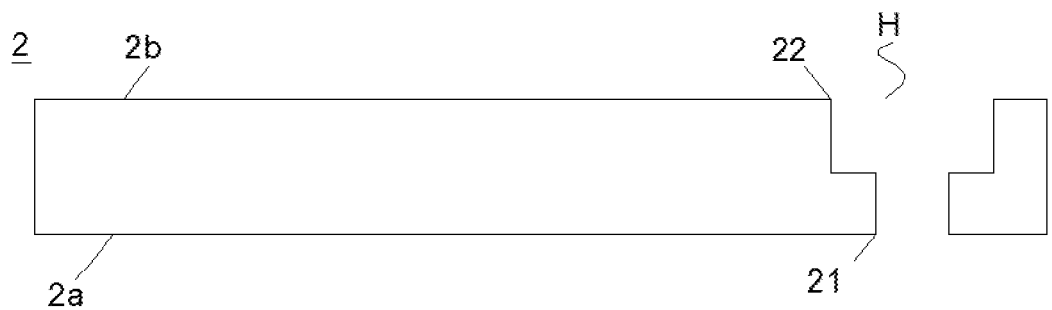
FIG. 2c is a schematic cross-sectional view of the polarizer shown in FIG. 2a taken along the line AA, according to some other embodiments of the present disclosure.

FIG. 2a is a schematic top view of a polarizer 2 according to some embodiments of the present disclosure (e.g., FIG. 2a shows a plain view of a second surface 2b of the polarizer 2 when being viewed by a user). FIG. 2b is a schematic cross-sectional view of the polarizer shown in FIG. 2a taken along a line AA according to some embodiments. FIG. 2c is a schematic cross-sectional view of the polarizer shown in FIG. 2a taken along the line AA according to some other embodiments. Referring to FIGS. 2a to 2c, an embodiment of the present disclosure provides the polarizer 2 having a first surface 2a and a second surface 2b which are parallel to a plane where the polarizer 2 is located, and the polarizer 2 has therein a through hole H penetrating through the first surface 2a and the second surface 2b. A boundary formed by the through hole H at the first surface 2a (e.g., a boundary between the through hole H and the first surface 2a) is a first boundary 21, and a boundary formed by the through hole H at the second surface 2b (e.g., a boundary between the through hole H and the second surface 2b) is a second boundary 22. An orthogonal projection of the first boundary 21 on a plane where the second surface 2b is located is inside the second boundary 22 and is not in contact with the second boundary 22, as shown in FIG. 2a. For boundaries formed by the through hole H at any two planes parallel to the plane where the polarizer 2 is located (e.g., in FIG. 2b or 2c, two planes which are parallel to the first surface 2a or the second surface 2b, located between the first surface 2a and the second surface 2b, and spaced apart from each other), an orthogonal projection of the boundary closer to the first surface 2a on a plane where the boundary farther away from the first surface 2a is located does not extend beyond the boundary farther away from the first surface 2a (e.g., the first boundary 21 does not extend beyond the second boundary 22).

Figure 3A:
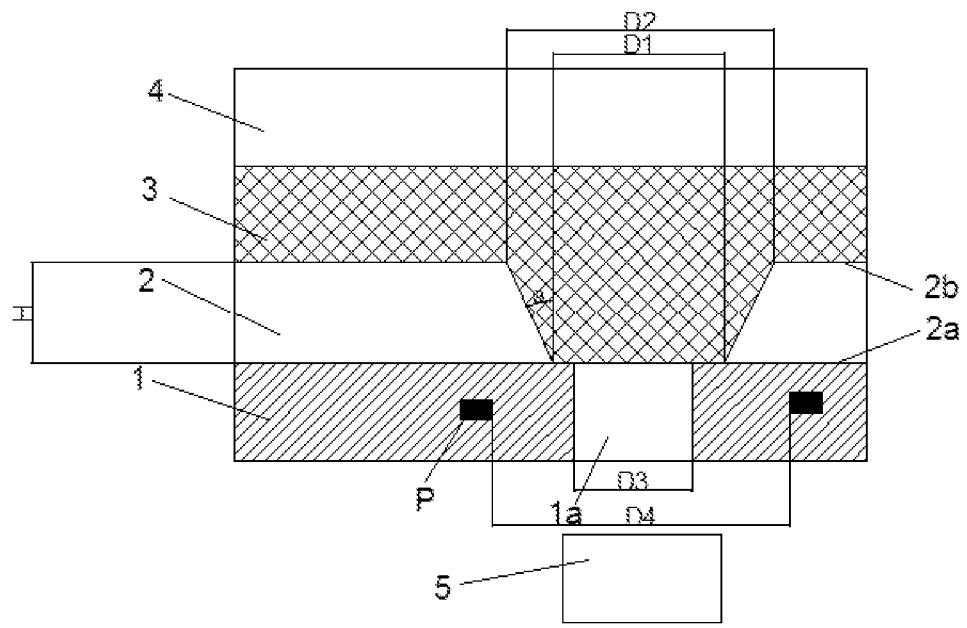
FIG. 3a is a schematic cross-sectional view of a display device according to some embodiments of the present disclosure.

In other words, unlike the case where the sidewall of the through hole 2h in the polarizer 2 shown in FIG. 1 is perpendicular to the first surface 2a or the second surface 2b of the polarizer 2, the sidewall of the through hole H in the polarizer 2 shown in FIGS. 2a to 2c is not perpendicular to the first surface 2a or the second surface 2b of the polarizer 2, and the through hole H gradually narrows down in a direction from the second surface 2b to the first surface 2a (e.g., in the case where the through hole H is in the form of a frustum of cone or a plurality of coaxial cylinders as described below, a diameter of the through hole H is gradually reduced in the direction from the second surface 2b to the first surface 2a). Referring to FIGS. 3a and 3b, if the liquid optical adhesive 3 is coated on the second surface 2b, the through hole H, which the liquid optical adhesive 3 comes into contact with when flowing into the through hole H, does not have a vertical sidewall and a large depth (e.g., the through hole 2h shown in FIG. 1), but has an inclined sidewall (e.g., the through hole H shown in FIG. 2b) or has a vertical sidewall and a small depth (e.g., the through hole H shown in FIG. 2c). As such, the liquid optical adhesive 3 can be attached to the sidewall of the through hole H better, thereby reducing or avoiding defects such as an air bubble at the top of the through hole H.

Referring to FIG. 2b, in some embodiments, the through hole H gradually narrows down in the direction from the second surface 2b to the first surface 2a. In other words, an opening of the through hole H at the second surface 2b may be a circle, an opening of the through hole H at the first surface 2a may be a circle, and the diameter of the through hole H is gradually decreased in the direction from the second surface 2b to the first surface 2a.

For example, referring to FIGS. 2a and 2b, a space defined by the through hole H may have a shape of a frustum of cone.

In FIG. 2b, a boundary where the through hole H intersects the cross-section taken along the line AA is an inclined straight line (i.e., the sidewall of the through hole H). Alternatively, the sidewall of the through hole H may be a curved line such as a parabola, as long as the through hole H is gradually narrows down in the direction from the second surface 2b to the first surface 2a.

Referring to FIG. 3a, when the liquid optical adhesive 3 flows into the through hole H, the liquid optical adhesive 3 comes into contact with the inclined sidewall of the through hole H, thereby facilitating the continuous flow of the liquid optical adhesive 3 along the sidewall of the through hole H, and reducing or avoiding the defects such as an air bubble.

Referring to FIG. 2c, in some embodiments, a boundary (i.e., the sidewall of the through hole H) formed by the through hole H at a plane perpendicular to the plane where the polarizer 2 is located has a stepped shape.

Referring to FIG. 3b, when the liquid optical adhesive 3 flows into the through hole H, although the liquid optical adhesive 3 contacts a vertical sidewall in each of a first part (e.g., the upper part having a larger diameter in FIG. 2c) and a second part (e.g., the lower part having a smaller diameter in FIG. 2c) of the through hole H, the vertical sidewall of each of the first and second parts is shallower (i.e., has a smaller depth), such that an air bubble is not easily generated.

For example, referring to FIG. 2c, the space defined by the through hole H is a plurality of (e.g., 2 or more) cylinders having diameters gradually decreasing in the direction from the second surface 2b to the first surface 2a, and an axis of each of the plurality of cylinders is perpendicular to the plane where the polarizer 2 is located (i.e., perpendicular to the first surface 2a or the second surface 2b of the polarizer 2). For example, the axes of the plurality of cylinders may coincide with each other.

Embodiments of the present disclosure further provide a display device, as shown in FIGS. 3a and 3b. The display device includes: a display panel 1; a polarizer 2, an optical adhesive 3, and a cover plate 4 sequentially disposed on a light outgoing surface of the display panel 1 (e.g., the upper surface of the display panel 1 shown in FIGS. 3a and 3b). The display panel 1 has a transparent region 1a, and the polarizer 2 may be the polarizer 2 according to any one of the embodiments described with reference to FIGS. 2a to 2c. The transparent region 1a is opposite to the through hole H of the polarizer 2 (e.g., in the direction perpendicular to the plane where the polarizer 2 is located, the transparent region 1a and the through hole H of the polarizer 2 overlap each other). The optical adhesive 3 is formed by curing a liquid optical adhesive, and the first surface 2a is proximal to (e.g., in contact with) the display panel 1. Of course, the second surface 2b of the polarizer 2 is proximal to (e.g., in contact with) the optical adhesive 3.

Since the through hole H in the polarizer 2 gradually narrows down in the direction from the second surface 2b to the first surface 2a, the liquid optical adhesive 3 comes into contact with a relatively gentle (i.e., not steep) sidewall when flowing into the through hole H, thereby suppressing or avoiding the defect of an air bubble.

In some embodiments, the display panel 1 is an organic light emitting diode display panel. A type of the display panel 1 is not limited in an embodiment of the present disclosure, as long as it is suitable for forming the transparent region 1a therein so as to facilitate the camera 5 to capture an image.

In some embodiments, the display device further includes the camera 5, and the camera 5 is located on a side of the display panel 1 distal to the polarizer 2 and opposite to the transparent region 1a (e.g., in the direction perpendicular to the plane where the polarizer 2 is located, the camera 5 and the transparent region 1a overlap each other). In other words, the camera 5 and the transparent region 1a overlap each other in the direction perpendicular to the first surface 2a or the second surface 2b of the polarizer 2. For example, in the direction perpendicular to the first surface 2a or the second surface 2b of the polarizer 2, a central axis of the camera 5 and a central axis of the transparent region 1a coincide with each other, such that external light uniformly enters the camera 5 through the transparent region 1a, thereby allowing the camera 5 to take a high-quality picture (or image) or high-quality video.

A size of the first boundary 21 should be as small as possible in comparison with a size of the second boundary 22 to form a more gentle (i.e., not steep) sidewall of the through hole H, such that the sidewall of the through hole H can better guide the flow of the liquid optical adhesive 3 and avoid the generation of an air bubble. The size of the second boundary 22 cannot be infinitely large and the second boundary cannot extend beyond a pixel region (i.e., a region where pixels P are located) of the display panel 1. Further, the size of the first boundary 21 cannot be infinitely small, and should be at least larger than a size of a photosensitive area of the camera 5 by a threshold to ensure that sufficient external light is received when the camera 5 captures an image or video.

In the case where the sidewall of the through hole H has a stepped shape, the larger the number of steps included in the sidewall is, the better the through hole H will be, and the more uniform heights of the steps are, the better the through hole H will be. However, the larger the number of the steps included in the sidewall is, the more complicated a manufacturing process of the through hole H will be. On balance, the sidewall of the through hole H may have 2 to 5 steps, of which heights are equal to each other (e.g., the "height" here means a size in the direction perpendicular to the first surface 2a or the second surface 2b of the polarizer 2). In other words, the through hole H may include 2 to 5 parts (e.g., cylinders), of which heights are equal to each other and diameters gradually decreases, in the direction from the second surface 2b to the first surface 2a.

Considering the state of an existing manufacturing process, the first boundary 21 extends beyond a size of an orthogonal projection of the transparent region 1a on the plane where the first surface 2a is located by a value greater than 0.05 mm. The second boundary 22 is located inside an orthogonal projection of the pixel region (in which the pixels closest to the transparent region are indicated as the pixels P) of the display panel 1 on the plane where the second surface 2b is located, and is spaced apart from the orthogonal projection by a value greater than 0.1 mm.

Referring to FIG. 3a, an angle a between a boundary formed by the through hole H at a plane perpendicular to the plane where the polarizer 2 is located and a normal (i.e., a normal line) of the plane where the polarizer 2 is located (i.e., an angle between the sidewall of the through hole H and the direction perpendicular to the first surface 2a or the second surface 2b of the polarizer 2) cannot be too small (e.g., the sidewall of the through hole H is a vertical sidewall in a case where the angle a is zero degrees, as shown in FIG. 1), and for example, the angle a is greater than or equal to 45°.

Referring to FIGS. 2b and 3a, in an embodiment, the transparent region 1a of the display panel 1 has a shape of a circle with a diameter D3=4 mm. The first boundary 21 has a shape of a circle with a diameter D1=4.2 mm, and the second boundary 22 has a shape of a circle with a diameter D2=4.8 mm. An inner boundary of the pixel region has a shape of a circle with a diameter D4=5.2 mm. The polarizer 2 has a thickness I=0.067 mm, and the angle a between the sidewall of the through hole H and the normal of the polarizer 2 is 77° (at this angle, the liquid optical adhesive 3 has good fluidity on the sidewall of the through hole H such that the generation of an air bubble is suppressed). It should be noted that sizes of the components shown in FIG. 3a are not necessarily in proportion to the above values, and the above values are merely exemplary examples.

Referring to labels shown in FIGS. 2c and 3b, in an embodiment, the transparent region 1a of the display panel 1 has a shape of a circle with the diameter D3=4 mm. The first boundary 21 has a shape of a circle with the diameter D1=4.2 mm, and the second boundary 22 has a shape of a circle with the diameter D2=4.8 mm. The inner boundary of the pixel region has a shape of a circle with the diameter D4=5.2 mm, and the polarizer 2 has the thickness I=0.067 mm. Further, the sidewall of the through hole H has a step with a depth S=0.04 mm.

In the above two embodiments, orthogonal projections of a center of the circle of the transparent region 1a, a center of the circle of the first boundary 21, a center of the circle of the second boundary 22, and a center of the circle of the pixel region on the plane where the polarizer 2 is located coincide with each other. As such, defects such as an air bubble generated when the liquid optical adhesive fills the through hole H can be reduced or avoided.

The display device may be any product or component with a display function, such as an organic light emitting diode display assembly, a mobile phone, a tablet computer, a display, a notebook computer, or the like. The display device may be applied to an application scene where the camera 5 is disposed under (i.e., on the back of) a display panel.

Referring to FIG. 4 and FIGS. 2a to 2c, embodiments of the present disclosure further provide a method for manufacturing the polarizer 2, and the method may include the following steps S1 and S2.

In step S1, a polarizer body is formed, such that the polarizer body has a first surface 2a and a second surface 2b parallel to a plane where the polarizer body is located. That is, a material layer, which has no through hole therein, for a polarizer is formed. For example, the material of the polarizer may be a material known in the art for a polarizer.

In step S2, a through hole H is formed to penetrate through the first surface 2a and the second surface 2b, a boundary formed by the through hole H at the first surface 2a is a first boundary 21, a boundary formed by the through hole H at the second surface 2b is a second boundary 22, an orthogonal projection of the first boundary 21 on a plane where the second surface 2b is located is inside the second boundary 22 and is not in contact with the second boundary 22, and for boundaries formed by the through hole H at any two planes parallel to the plane where the polarizer 2 is located, an orthogonal projection of the boundary closer to the first surface 2a on a plane where the boundary farther away from the first surface 2a is located does not extend beyond the boundary farther away from the first surface 2a.

The polarizer 2 so manufactured can suppress defects such as an air bubble when the liquid optical adhesive 3 fills the through hole of the polarizer 2.

In some embodiments, the through hole H is formed through a laser process.

For example, a laser beam may be controlled to cut the polarizer body obliquely with respect to the polarizer body to form the through hole H, thereby forming the shape of the sidewall of the through hole H as shown in FIG. 2b.

For another example, the laser beam may be controlled to cut the polarizer body vertically with respect to the polarizer body twice to form the through hole H. Specifically, a part (e.g., a cylinder) of the through hole H having a smaller inner diameter is formed by cutting the polarizer body on the side of the first surface 2a for the first time, and another part (e.g., another cylinder) of the through hole H having a larger inner diameter is formed by cutting the polarizer body on the side of the second surface 2b for the second time.

Of course, a process for forming the through hole H of the polarizer 2 having the inclined sidewall or the stepped sidewall is not limited to the above examples. For example, the through hole H may alternatively be formed through another laser cutting process.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the scope of the disclosure as defined in the appended claims, and such changes and modifications also fall within the scope of the disclosure.

What is claimed is:

1. A display device, comprising:
   a display panel; and
   a polarizer, an optical adhesive, and a cover plate sequentially arranged on the display panel, wherein
   the display panel has a transparent region;
   the polarizer has a first surface and a second surface which are parallel to a plane where the polarizer is located, the first surface is closer to the display panel than the second surface, and the polarizer has therein a through hole penetrating through the first surface and the second surface;
   a boundary of the through hole at the first surface is a first boundary, a boundary of the through hole at the second surface is a second boundary, and an orthogonal projection of the first boundary on a plane where the second surface is located is inside the second boundary and is not in contact with the second boundary;
   for boundaries of the through hole at any two planes parallel to the plane where the polarizer is located, an orthogonal projection of a boundary closer to the first surface on a plane where a boundary farther away from the first surface is located does not extend beyond the boundary farther away from the first surface;
   the transparent region is opposite to the through hole of the polarizer, and the optical adhesive is a cured liquid optical adhesive; and
   the second boundary is inside an orthogonal projection of a pixel region of the display panel on the plane where the second surface is located, and spaced apart from the orthogonal projection of the pixel region of the display panel on the plane where the second surface is located by a distance greater than 0.1 mm.

2. The display device according to claim 1, wherein an orthogonal projection of the transparent region on a plane where the first surface is located is within the first boundary, and a distance between an outside of the orthogonal projection of the transparent region on the plane where the first surface is located and the first boundary is greater than 0.05 mm.

3. The display device according to claim 1, wherein the transparent region has a shape of a circle, the first boundary has a shape of a circle, the second boundary has a shape of a circle, and the pixel region has a shape of a circle; and
   wherein orthogonal projections of centers of the circles of the transparent region, the first boundary, the second boundary, and the pixel region on the plane where the polarizer is located coincide with each other.

4. The display device according to claim 1, wherein the display panel is an organic light emitting diode display panel.

5. The display device according to claim 1, further comprising a camera which is on a side of the display panel distal to the polarizer, and is opposite to the transparent region,
   wherein the camera and the transparent region overlap each other in a direction perpendicular to the plane where the polarizer is located.

6. The display device according to claim 1, wherein a sidewall of the through hole has a stepped shape.

7. The display device according to claim 6, wherein a space defined by the through hole comprises a plurality of cylinders having diameters gradually decreasing in a direction from the second surface to the first surface, and an axis of each of the plurality of cylinders is perpendicular to the plane where the polarizer is located; and
   wherein axes of the plurality of cylinders coincide with each other.

8. The display device according to claim 1, wherein the through hole gradually narrows down in a direction from the second surface to the first surface.

9. The display device according to claim 8, wherein a space defined by the through hole has a shape of a frustum of cone.

10. The display device according to claim 9, wherein a sidewall of the through hole and a normal of the plane where the polarizer is located have an angle equal to or greater than 45° therebetween.

11. The display device according to claim 10, wherein the angle between the sidewall of the through hole and the normal of the plane where the polarizer is located is equal to 77°.

12. A polarizer, comprising a first surface and a second surface which are parallel to a plane where the polarizer is located, wherein
   the polarizer has therein a through hole penetrating through the first surface and the second surface, a boundary of the through hole at the first surface is a first boundary, a boundary of the through hole at the second surface is a second boundary, and an orthogonal projection of the first boundary on a plane where the second surface is located is inside the second boundary and is not in contact with the second boundary;
   for boundaries of the through hole at any two planes parallel to the plane where the polarizer is located, an orthogonal projection of a boundary closer to the first surface on a plane where a boundary farther away from the first surface is located does not extend beyond the boundary farther away from the first surface; and
   the second boundary is inside an orthogonal projection of a pixel region of a display panel, which is to be arranged on the first surface of the polarizer, on the plane where the second surface is located, and spaced apart from the orthogonal projection of the pixel region of the display panel on the plane where the second surface is located by a distance greater than 0.1 mm.

13. The polarizer according to claim 12, wherein the first boundary has a shape of a circle, and the second boundary has a shape of a circle; and
wherein orthogonal projections of centers of the circles of the first boundary and the second boundary on the plane where the polarizer is located coincide with each other.

14. The polarizer according to claim 12, wherein the display panel has a transparent region, the transparent region has a shape of a circle, the first boundary has a shape of a circle, the second boundary has a shape of a circle, and the pixel region has a shape of a circle; and
wherein orthogonal projections of centers of the circles of the transparent region, the first boundary, the second boundary, and the pixel region on the plane where the polarizer is located coincide with each other.

15. The polarizer according to claim 12, wherein a sidewall of the through hole has a stepped shape.

16. The polarizer according to claim 15, wherein a space defined by the through hole comprises a plurality of cylinders having diameters gradually decreasing in a direction from the second surface to the first surface, and an axis of each of the plurality of cylinders is perpendicular to the plane where the polarizer is located; and
wherein axes of the plurality of cylinders coincide with each other.

17. The polarizer according to claim 12, wherein the through hole gradually narrows down in a direction from the second surface to the first surface.

18. The polarizer according to claim 17, wherein a space defined by the through hole has a shape of a frustum of cone.

19. The polarizer according to claim 18, wherein a sidewall of the through hole and a normal of the plane where the polarizer is located have an angle equal to or greater than 45° therebetween.

20. The polarizer according to claim 19, wherein the angle between the sidewall of the through hole and the normal of the plane where the polarizer is located is equal to 77°.

* * * * *